(12) United States Patent
LeClaire et al.

(10) Patent No.: US 8,562,749 B2
(45) Date of Patent: *Oct. 22, 2013

(54) WAFER FABRICATION PROCESS

(75) Inventors: Jeffrey E. LeClaire, Boca Raton, FL (US); Kenneth G. Roessler, Boca Raton, FL (US); David Brinkley, Baltimore, MD (US)

(73) Assignee: Rave LLC, Delray Beach, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/475,997

(22) Filed: May 20, 2012

(65) Prior Publication Data

US 2012/0231397 A1  Sep. 13, 2012

Related U.S. Application Data

(63) Continuation of application No. 12/188,564, filed on Aug. 8, 2008, now Pat. No. 8,182,609.

(60) Provisional application No. 60/954,986, filed on Aug. 9, 2007.

(51) Int. Cl.
*B08B 7/00* (2006.01)

(52) U.S. Cl.
USPC .............. 134/1; 134/1.3; 134/42; 134/902

(58) Field of Classification Search
None
See application file for complete search history.

(56) References Cited

U.S. PATENT DOCUMENTS 6,352,081 B1 * 3/2002 Lu et al. .................. 134/22.1
2008/0241711 A1 * 10/2008 Yun et al. ..................... 430/5

* cited by examiner

*Primary Examiner* — Michael Kornakov
*Assistant Examiner* — Nicole Blan
(74) *Attorney, Agent, or Firm* — Baker & Hostetler LLP

(57) ABSTRACT

A wafer fabrication process with removal of haze formation from a pellicalized photomask surface is provided. The wafer fabrication process includes pre-print wafer processing, wafer print processing using at least one photomask having a pellicle, photomask clean processing, wafer print processing using the photomask, and post-print wafer processing. The photomask clean processing step includes directing a laser through the pellicle towards an inorganic particle disposed on the photomask to remove the particle from the photomask by thermal decomposition.

12 Claims, 12 Drawing Sheets

WAFER FABRICATION PROCESS

CROSS-REFERENCE TO RELATED APPLICATIONS

This application is a continuation of U.S. patent application Ser. No. 12/188,564, filed on Aug. 8, 2008, now U.S. Pat. No. 8,182,609 (issued on May 22, 2012), which claims priority to U.S. Patent Application Ser. No. 60/954,986, filed Aug. 9, 2007, entitled "Apparatus and Method for Direct Surface Cleaning," the disclosures of which are hereby incorporated by reference in their entirety.

FIELD OF THE INVENTION

The present invention relates generally to wafer fabrication processes. More particularly, the present invention relates to wafer fabrication processes that include photomask cleaning processes.

BACKGROUND OF THE INVENTION

Electromagnetic radiation has long been used for surface cleaning Examples of these processes include the removal of surface contamination, removal of thin material layer coatings such as paints or removal of oils from metal work surfaces. Some of the earliest examples utilized flash lamp radiation sources. These systems can be limited in application because of peak powers achievable.

Lasers have increasingly been used for these types of processes because of the high peak powers achievable, high energy stability and wavelength selectivity. These features allow for high localization, improved material selectivity, and depth control of the cleaning effect. Laser surface cleaning processes can be broadly categorized into surface contamination layer removal and particulate removal. Removal of surface contamination layers is normally accomplished by laser ablation. Particle removal involves removing the contamination as a whole.

Cleaning processes under both categories can benefit from the use of pulsed laser radiation to provide higher peak powers. Short pulsed radiation in particular can provide improved processing. Short pulsed radiation has been shown to decrease the heat affected zone in laser ablation processing. This allows improved localization of the ablative removal as well as finer control of the removal depth. Short pulse radiation also can enhance particulate removal by increasing the rate of thermal increase within the particles and/or substrate thereby increasing the acceleration forces that produce particle removal.

Substrate damage can be an issue for both ablative and particulate removal processes and several techniques have been developed to minimize these effects. For ablative processes, selecting a wavelength that increases the absorption of the contaminant can reduce the fluence requirement and therefore reduce substrate damage. In addition, using multiple pulses for full contaminant removal can reduce the required fluence. However, substrates that have high absorption at the selected wavelengths are likely to be ablated along with the contamination, even with wavelength selection and multiple pulse removal processes. The ability to end stop the removal process at the substrate interface will be limited in these cases. This problem is significantly increased for smaller size contamination, since the absorption cross section for the contamination is reduced relative to the substrate.

As with ablative removal processes, particulate removal processes can also cause substrate damage for sensitive substrates and substrates that have high absorption at the processing wavelength. This problem is increased for small particle removal because of increased adhesion forces between the particles and substrate and self focusing of the laser underneath the particles. For particle cleaning processes, the developed methods for reducing the risk of substrate damage involve controlling the environment above the contaminated surface. Examples of particulate laser processes allowing reduced fluence levels include wet laser cleaning, steam laser cleaning, and increased humidity cleaning. Combinations of laser and other cleaning process (including etching, organic solvents, and ultrasonic) have been shown to increase cleaning effectiveness and may reduce the risk of substrate damage. However, with the exception of dry laser cleaning processes, all of the particulate removal processes described require access to the environment above the substrate surface. This may be impractical for some systems.

Alternative dry laser particulate cleaning processes have been developed. Laser acoustic wave cleaning and laser shock wave cleaning are dry laser cleaning methods that have also been evaluated for particulate cleaning Laser acoustic wave cleaning involves direct excitation to the substrate and therefore suffers from a high potential for substrate damage particularly for small particles as discussed. Laser shock wave cleaning has been shown to improve particulate removal and can reduce the risk of substrate damage by focusing the laser above the substrate surface and relying on the shock wave interaction with the particulates. This technique will also have increased difficulty when applied to small particle removal. In addition, the shock wave may damage other sensitive features on or near the surface of the substrate. This is particularly true if there is a sensitive material above the substrate surface, since generating the shock wave requires relatively high laser intensity focused above the substrate.

Even the newest dry laser techniques can also be limited in cases where access to the environment above the surface is not practical (i.e. Enclosed systems). The removal process will only move the particle to a different location on the substrate for an enclosed system, because the particles are removed from the surface as a whole. Typically these techniques utilize additional control devices and/or methods to completely remove the particles from the substrate being cleaned. These methods include directed air flow, use of reduced pressure (vacuum) or gravity, all of which require open access to the environment above the substrate surface.

Semiconductor manufacturing is one of the major industrial areas that utilize surface cleaning processes including laser cleaning methods. Many of the required cleaning processes have a stringent tolerance on the allowable level of substrate damage. In addition, the small product features make it necessary to remove very small particles avoid product failures. Cleaning is an issue in multiple wafer processing steps and includes extended contamination layer (i.e. resist removal) and particulate contamination removal.

Surface cleaning is also a requirement for the optics (e.g. photomasks) used in the wafer manufacturing process. For photomasks in particular, a build up of contamination is observed during the normal usage of the masks in the wafer print processes. These masks are exposed to deep ultraviolet (DUV) radiation during normal process use in order to print the mask pattern onto the wafer. Exposure to this radiation produces a contamination growth in the form of small particles that absorb the illuminating radiation. This growth is commonly referred to as photo-induced defects or haze.

Haze formation is a problem for the wafer print process because as the particles increase in size they block more of the light being transmitted through the photomask. Eventually the haze contamination absorbs enough of the light to cause defects in the printed image of the photomask on the wafer. Before the haze contamination reaches this level, the photomask surface must be cleaned. This cleaning requirement has the affect of decreasing the useable lifetime of a photomask because the processes currently used to remove haze deteriorate the absorbing film on the mask. Duplicate sets of photomasks must be made in order to continue manufacturing once the useable life of a photomask is exceeded. Duplicate sets are also required for use while contaminated photomask are being cleaned. There can be a several day time requirement before the mask is cleaned and verified, since the cleaning processes are typically preformed at a different facility. As the required feature size for semiconductor manufacture decreases, the size of haze growth that will produce printed defects also decreases. This increased sensitivity to haze growth means that the newest photomasks will need to be cleaned more frequently and will have a shorter useable life.

Application of alternative cleaning methods to remove photomask surface haze contamination is hindered by the use of pellicles attached to the photomask surface(s). A pellicle consists of a frame that is adhesively bonded to the photomask surface and a thin membrane stretched across the pellicle frame. Pellicles are used to prevent externally generated particles from settling onto the surface of the photomask where they could affect the print process. Externally generated particles settle on the membrane above the mask surface where they have a significantly reduced affect on the print process. With the exception of a small valve on the pellicle frame to allow for pressure equalization, the top surface of the photomask is effectively sealed from the local environment by the pellicle attachment.

The current accepted method for haze removal requires the wafer manufacture to ship the contaminated photomask back to the mask maker or to a third party. Here the pellicle frame is removed from the photomask, the mask is cleaned, inspected for defects and a new pellicle is attached to the photomask and in many cases the mask is inspected again for particle defects before it is shipped back to the wafer manufacture. This typically takes days to complete, increases the photomask cost due to the additional processing and degrades the photomask quality due to the cleaning process. Additionally there is a small probability, usually due to adhesive from the pellicle being removed and falling onto printable areas of the photomask, that the mask will be damaged beyond use by the haze removal process.

Current efforts to improve the issues related to haze growth on photomasks have focused on processes that can be implemented before the pellicle is added because of the difficulties related to through pellicle cleaning These efforts have been primarily focused on surface preparation and use of alternate chemicals in the cleaning processes. The latter has been shown to change the haze contamination species but not eliminate them. Both areas, at best, show a reduction in the growth rate and do not eliminate the requirement for cleaning. More recently, use of an inert environment has been shown to decrease the growth rate of haze formation on photomasks. Application of this method requires control of all environments the photomask is exposed to including all process equipment. As with other methods being developed, this process has the potential to reduce the growth rate but not eliminate the requirement for and the detrimental effects of cleaning.

At least in view of the above, it would be advantageous to develop novel cleaning methods and/or apparatuses for removing haze contamination from a photomask surface that avoids the detrimental effects of the currently-available cleaning processes.

It would be additionally advantageous to develop novel laser based cleaning methods and/or apparatuses for removing haze contamination from a photomask surface without pellicle removal, because of the limited applicability of demonstrated laser based cleaning methods.

It would be additionally advantageous to integrate methods and/or apparatuses for removing haze contamination from a photomask surface into a wafer fabrication process.

It would be additionally advantageous to develop a method and/or apparatus for removing haze contamination from a photomask surface that was minimally dependent or independent of particle/contamination size.

It would be additionally advantageous to develop a method and/or apparatus for recovering the transmission losses, during the wafer print process, caused by absorption of the print radiation by photo-induced defects.

SUMMARY OF THE INVENTION

Embodiments of the present invention provide a wafer fabrication process, including pre-print wafer processing, wafer print processing using at least one photomask having a pellicle, photomask clean processing, wafer print processing using the photomask, and post-print wafer processing. The photomask clean processing step includes directing a laser through the pellicle towards an inorganic particle disposed on the photomask to remove the particle from the photomask by thermal decomposition.

There have thus been outlined, rather broadly, certain features of the invention in order that the detailed description thereof that follows may be better understood, and in order that the present contribution to the art may be better appreciated. There are, of course, additional features of the invention that are described below and form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments, and of being practiced and carried out in various ways. It is also to be understood that the phraseology and terminology employed herein, as well as the abstract, are for the purpose of description, and should not be regarded as limiting.

As such, those skilled in the art will appreciate that the conception upon which this disclosure is based may readily be utilized as a basis for the designing of other structures, methods, and systems for carrying out the several purposes of the present invention. It is important, therefore, that the claims be regarded as including such equivalent constructions insofar as they do not depart from the spirit and scope of the present invention.

DETAILED DESCRIPTION

Figure 1A:
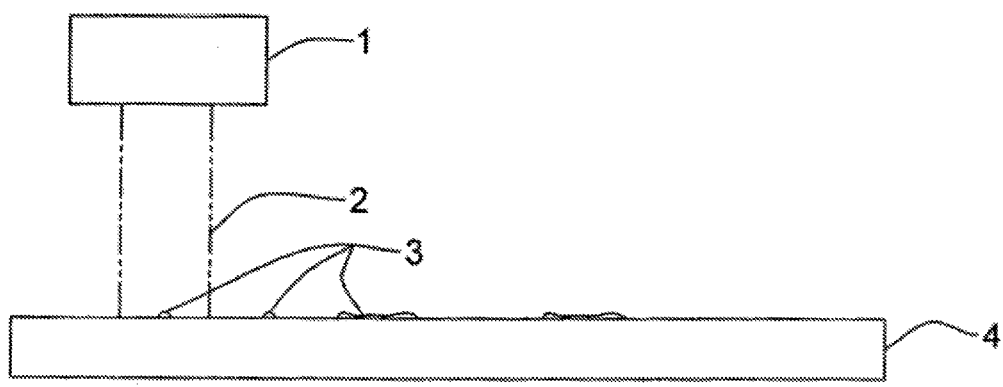
FIG. 1a illustrates a schematic diagram of laser excitation and surface contamination, in accordance with an embodiment of the present invention.
Figure 1B:
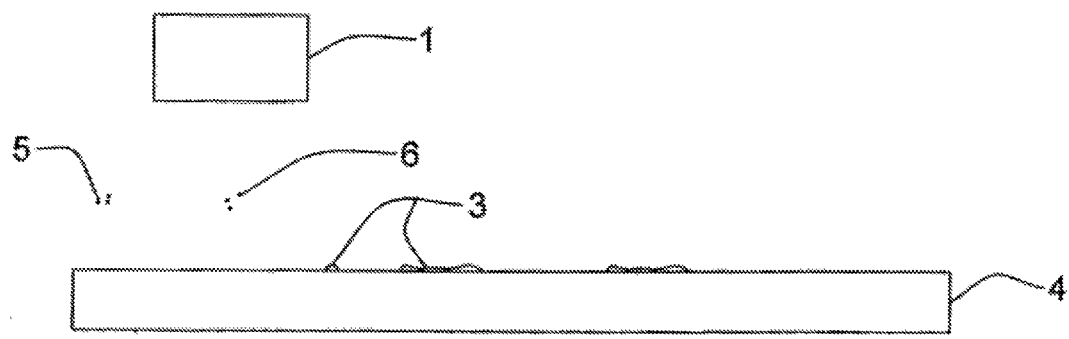
FIG. 1b illustrates a schematic diagram of a substrate surface demonstrating contamination removal, in accordance with an embodiment of the present invention. According to certain embodiments of the present invention, multiple species may be removed from the mask in the form of a gas, liquid/solid vapor, etc.

The invention will now be described with reference to the drawings, in which like reference numerals refer to like parts throughout, According to one embodiment of the present invention, a method for laser surface cleaning is provided where access to the environment above the substrate surface has limited or no access. The method typically includes the direct laser excitation of a contaminating particulate or contamination layer on a substrate surface (FIG. 1a), where (1) is the laser, (2) is the laser beam, (3) are the particulates or layer contamination to be removed and (4) is the substrate. The contaminating particulate or contamination layer may be, for example, inorganic. However, energy sources other than laser may also be used (e.g., lamps and other devices that can radiate energy all along the electromagnetic spectrum may be used, including generators of gamma rays, x-rays, ultraviolet light, visible light, infrared radiation, microwave radiation, radio waves, etc.) The excitation increases the temperature within the contaminant and produces a thermally based removal (FIG. 1b), including but not limited to vaporization (5) and decomposition (6). The method provides a particular advantage but is not limited to applications where the environment above the contaminated substrate is substantially or fully enclosed. In these cases, the method may also include directing the laser beam through a material disposed relative to the surface that is part of the substrate's environmental enclosure.

According to alternative embodiments of the present invention, the method may include the use of contamination ablation and/or the use of shock waves generated above the contaminated substrate surface. As with the first embodiment mentioned above, the alternative embodiments may include directing the beam through a material disposed relative to the surface that is part of the substrates environmental enclosure. It should be noted that the processes used in methods according to some of embodiments of the present invention may sometimes also be applicable to alternate embodiments of the present invention.

According to certain embodiments of the present invention, the method has a reduced risk of substrate damage because it relies on a thermal based removal of the contamination. The primary reduction in the risk of substrate damage over other known techniques is typically due to the relatively low temperature requirement for the thermal removal process compared to the thermal damage thresholds for the substrate material(s). The risk of substrate damage is also sometimes reduced because the nominal pulse-width requirements are commonly relatively long so the potential for multi-photon absorption processes is reduced. According to certain embodiments, the method provides for improved removal of small contaminants/particles because of the reduced fluence allowed by the lower temperature requirement.

Methods according to certain embodiments of the present invention include selecting a laser wavelength that coincides with a strong absorption of the contaminating species and/or a weak absorption of the substrate and setting the laser energy and pulse width to produce the desired cleaning effect. Increased absorption in the contaminant will typically allow lower laser energies to be used for the clean process and therefore, can decrease the potential for substrate damage. This may become particularly important when the substrate materials are highly absorbing at the selected wavelength. The use of multiple laser wavelengths in the cleaning process may be employed, if more than one contaminating species is present or if the contaminant species has multiple high absorbance components. Multiple wavelengths may also be used for the same component if it undergoes a material or material properties change during a first step of the cleaning process. Multiple wavelengths may be produced by utilizing multiple laser sources or a single tunable laser source or both.

EXAMPLES

The following are examples of methods according to certain embodiments of the present invention applied to surface cleaning of photo-induced defects or haze contamination from photomask substrates used in wafer fabrication processes. These examples are not limiting to the present invention and may be modified in any manner that will become apparent to one of skill in the art upon practicing one or more embodiments of the present invention.

Figure 2:
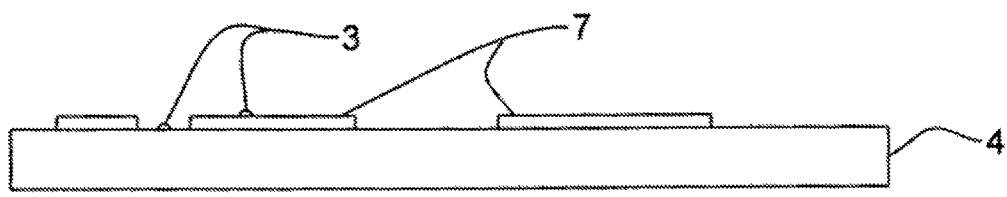
FIG. 2 illustrates a diagram of a photomask surface with thin film absorber on top including contamination on the film and on the substrate, in accordance with an embodiment of the present invention.

Control of the laser beam parameters is sometimes critical in the application of the invention to photomask surface cleaning of haze contamination. Wavelength selection may also sometimes be critical because of the physical structure of the typical photomask. In most cases, a photomask (FIG. 2) consists of a quartz substrate (4) with a thin absorbing film (7) on the critical surface. In the case of a metal film there will typically be a significant absorption coefficient for the majority of producible laser wavelengths. In this case, it can be critical to have a high absorption in the haze species in order to avoid generating a film temperature above its damage threshold or above the damage threshold of the underlying quartz substrate. In the case of partial absorbing photomask films, there may be wavelength regions where the film does not significantly absorb. The substrate (quartz) in this example is by design transmitting in the wavelength range used for the lithography process. There will typically be a significant range from the UV to the mid IR wavelength range where the quartz substrate will be weakly absorbing, because of the purity of the quartz materials used.

A specific example of a method according to the present invention includes the removal of ammonium sulfate haze from the surface of a photomask. In this example, ammonium sulfate is expected to decompose at temperatures above 280° C. The lowest thermal damage point for a typical photomask according to this embodiment will be the melting/reflow point for the base quartz substrate (i.e., around 1600° C.). Therefore, there is a potential process where the temperature for contamination removal/cleaning can occur that is below the damage level of the substrate materials. This illustrates the basis of the inventive concept in this embodiment. However, the relative absorption in the ammonium sulfate and in the photomask substrate and film material should typically be considered. If the absorption is higher in the substrate or thin film than in the haze, a higher temperature will typically be produced in the substrate relative to the haze. This potential issue is exacerbated by the fact that the haze contamination is typically small compared to the substrate material and will therefore have a reduced absorption cross section. This illustrates why wavelength selection may be a particularly important step to implementation of this method.

Figure 3:
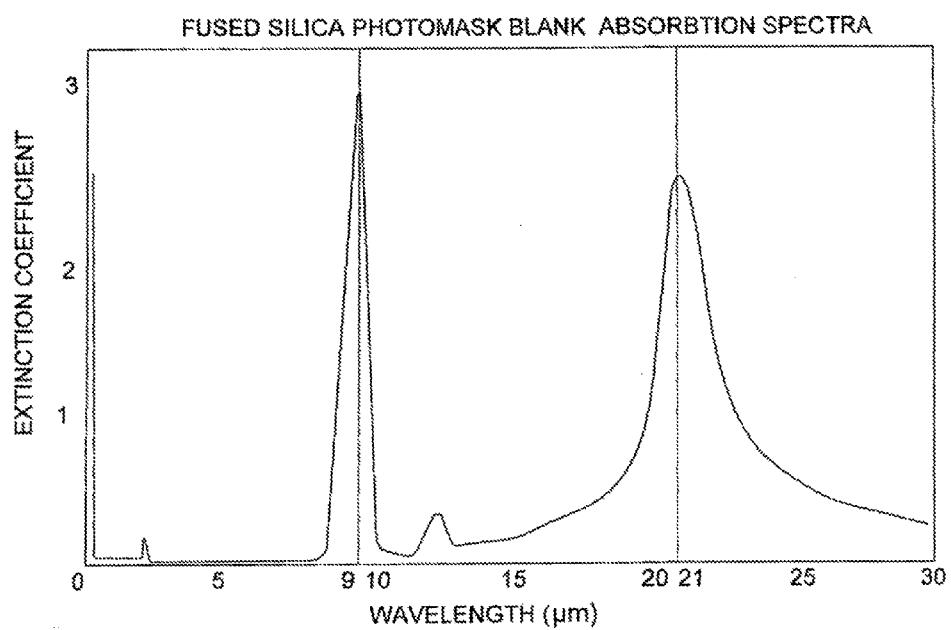
FIG. 3 illustrates a plot of ammonium sulfate absorption in the near to mid infrared region of the electromagnetic spectrum, in accordance with an embodiment of the present invention.

Ammonium sulfate has several significant absorption peaks in the Mid IR wavelength range (FIG. 3). Selecting one of the wavelengths, for example around 3 µm, 7 µm or 9 µm, would increase the absorption in the ammonium sulfate and decrease the risk of damage to the film or substrate. If the photomask has a metal film layer (i.e. chrome), there could be an advantage to selecting one of the longer wavelength absorption peaks (i.e. 7 µm or 9 µm), because the reflectivity of the metal film increases with increasing wavelength in this region. This reduces the light available to be absorbed by the film.

According to certain embodiments, it may be preferable to use the 7 µm wavelength because there is a significant quartz absorption in the 9 µm wavelength range. If the photomask had a partially absorbing film coating (i.e. MoSi) it could become advantageous to use a laser wavelength around the 3 µm absorption of ammonium sulfate. At this wavelength, both the film and the quartz are very weak absorbers and a higher intensity could be used for cleaning without risk of substrate damage. Coincidentally, the 3 µm wavelength range could become advantageous to use for an ablative removal cleaning of ammonium sulfate since this process typically requires a very weak absorption of the substrate materials to avoid damage.

The process just described for use according to certain embodiments of the present invention could increase the useable lifetime of a photomask by replacing the current cleaning processes used to remove haze from photomask surfaces. Unlike the typical chemical clean processes used for haze cleaning, low temperature laser removal of haze contamination would not in general decrease the absorber thickness and line widths of the absorber film. This loss of material limits the number of clean process that the photomask can tolerate before affecting the microelectronic devices performance. In theory, an unlimited number of cleaning cycles could be used with the laser clean process. One of the reasons that aggressive wet clean processes are used is the fact that removal of the pellicle frame from the photomask leaves an adhesive residue. Wet clean processes in general will affect the adhesive residue causing the adhesive to contaminate working areas of the mask, because they are difficult to localize. The laser clean process disclosed, however, can be localized away from the adhesive residues leaving them unaffected. A controlled removal of the pellicle frame and majority of adhesive followed by the inventive laser clean process could allow a subsequent pellicle attachment without a wet clean requirement (aggressive or otherwise).

Figure 4:
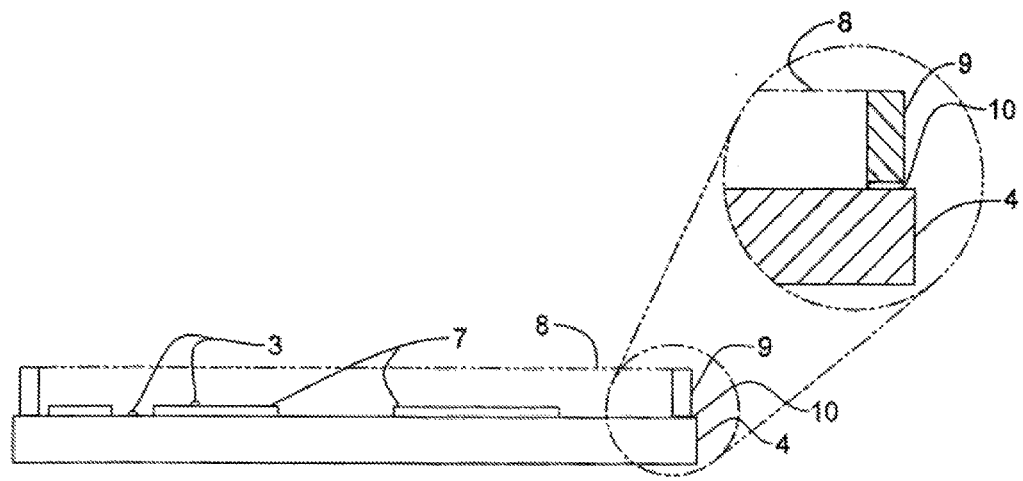
FIG. 4 illustrates a diagram of a photomask surface with thin film absorber including pellicle attached to surface, in accordance with an embodiment of the present invention. According to certain embodiments of the present invention, contamination may be present on the film and/or on the substrate.

According to certain embodiments of the present invention, the method applied to photomask haze cleaning does not require removal of the pellicle. Rather, the laser cleaning method is performed through the pellicle film material without affecting the pellicle film characteristics (FIG. 4) where (8) is the pellicle film, (9) is the pellicle frame and (10) is the adhesive between the frame and the photomask substrate. In this case, the absorption of the pellicle film at the process wavelength and the energy density (fluence) at the surface of the pellicle film should be considered. As with the substrate and substrate film coating, the cleaning process typically does not produce a temperature increase in the pellicle film that is above the damage threshold. For the example of ammonium sulfate removal from a photomask surface arguments similar to those made for the film and substrate damage apply. Some pellicle films will have weak absorption near the 3 µm absorption peak of ammonium sulfate. Depending on the pellicle film however, there may be significant absorption in the pellicle film near the 7 and 9 µm absorption peaks for Ammonium Sulfate. It is still possible to operate in a region of significant pellicle film absorption (i.e. longer wavelengths in the discussed example), because the pellicle film is positioned above the substrate surface.

Figure 5A:
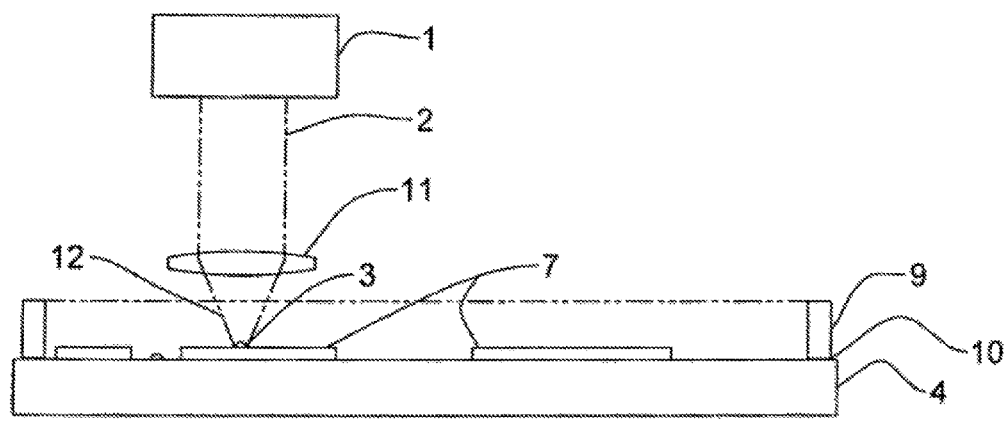
FIG. 5a illustrates a schematic diagram of a photomask with a pellicle showing laser beam focused through the pellicle and onto the surface, in accordance with an embodiment of the present invention.

Focusing of the laser beam through the pellicle film and onto the substrate surface (FIG. 5*a*) where (11) is the focus lens and (12) is the focused laser beam, in addition to wavelength selection, can reduce the relative temperature increase in the pellicle film. The temperature increase in any substance is proportional to the fluence applied to the surface:

$$\Delta T \sim F \quad \text{(Equation 1)}$$

Where $\Delta T$ is the temperature change within the material and F is the absorbed laser fluence.

For a constant intensity or beam pulse energy, the fluence is inversely proportional to the square of the beam spot radius:

$$F \sim E/r^2 \quad \text{(Equation 2)}$$

Where F is the fluence, E is the energy and r is the radius of the beam on the substrate surface.

Figure 5B:
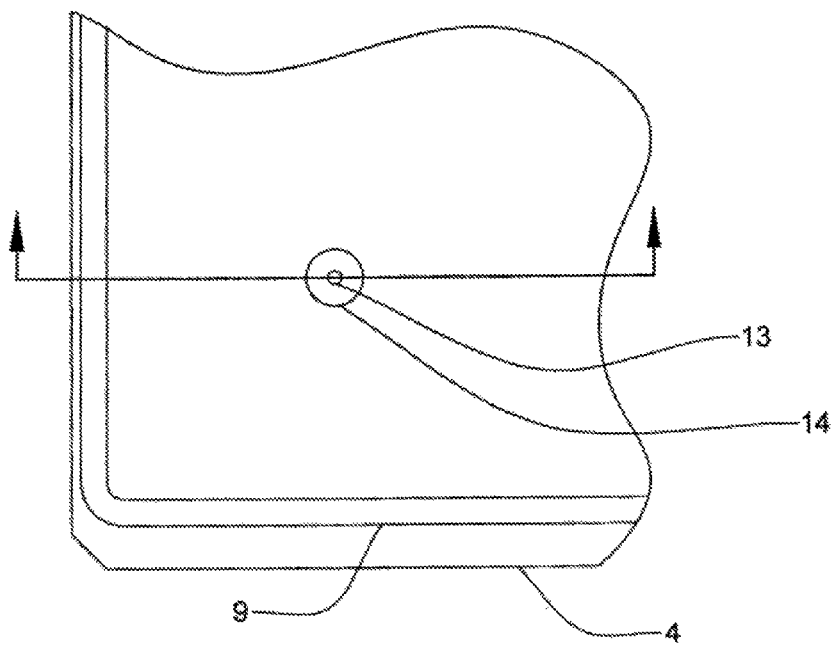
FIG. 5b illustrates a schematic diagram of the beam spot size on the pellicle versus on the mask produced by focusing, in accordance with an embodiment of the present invention.
Figure 5C:
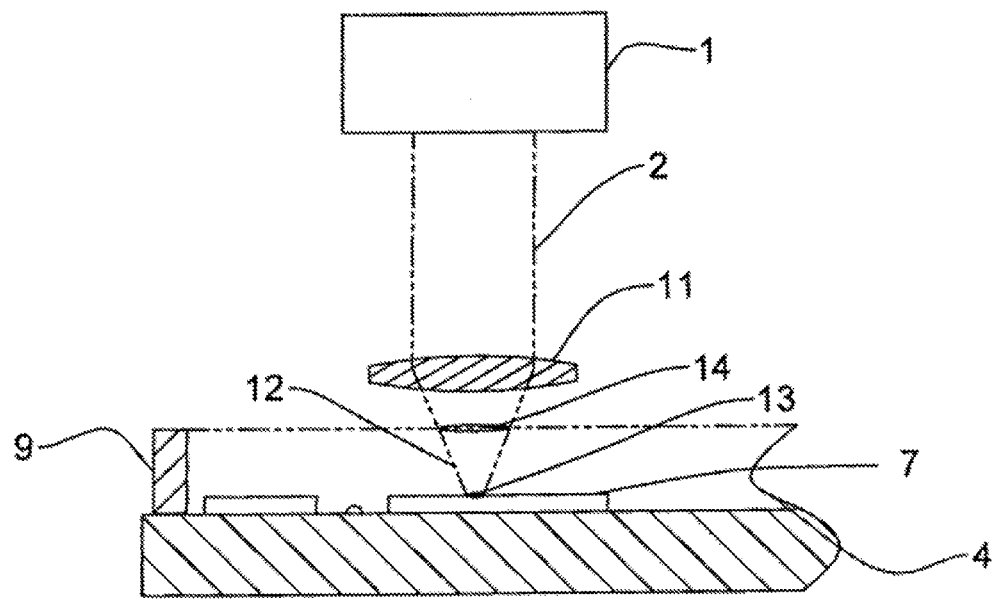
FIG. 5c illustrates a schematic diagram of a photomask with a pellicle showing laser beam focused through the pellicle and onto the surface and a side view of the beam spot on the pellicle, in accordance with an embodiment of the present invention.

The ratio of the beam radius at the pellicle to the beam radius on the mask surface is typically increased by focusing the beam through the pellicle and, therefore, the relative fluence on the pellicle film compared to the photomask substrate surface can be reduced (FIG. 5*b*). Here (13) is the laser beam diameter at the substrate surface and (14) is the diameter at the pellicle film.

Pulse Shaping

The pulse width, temporal pulse shape and the spatial distribution of the laser may be used to enhance the cleaning process or increase the safe operation range for processing. Shorter pulse widths can be used to minimize the overall thermal input to the system (substrate and contamination). Longer pulse widths may be used to maintain the process temperature for an extended period of time enhancing the completeness of the thermal removal process. The temporal pulse shape can be used to control the temperature rise within the contaminating species. A long temperature rise may be used to produce an initial effect (such as melting) that would be followed by a secondary effect (such as decomposition). A shorter rise time, according to certain embodiments of the present invention, enhances vaporization of the contaminant while limiting the decomposition processes. Combinations of short and long temporal pulse shape can also be used to optimize the removal process. The use of multiple pulses can also be used to lower beam energy required for complete cleaning further decreasing the risk of substrate damage.

Figure 6A:
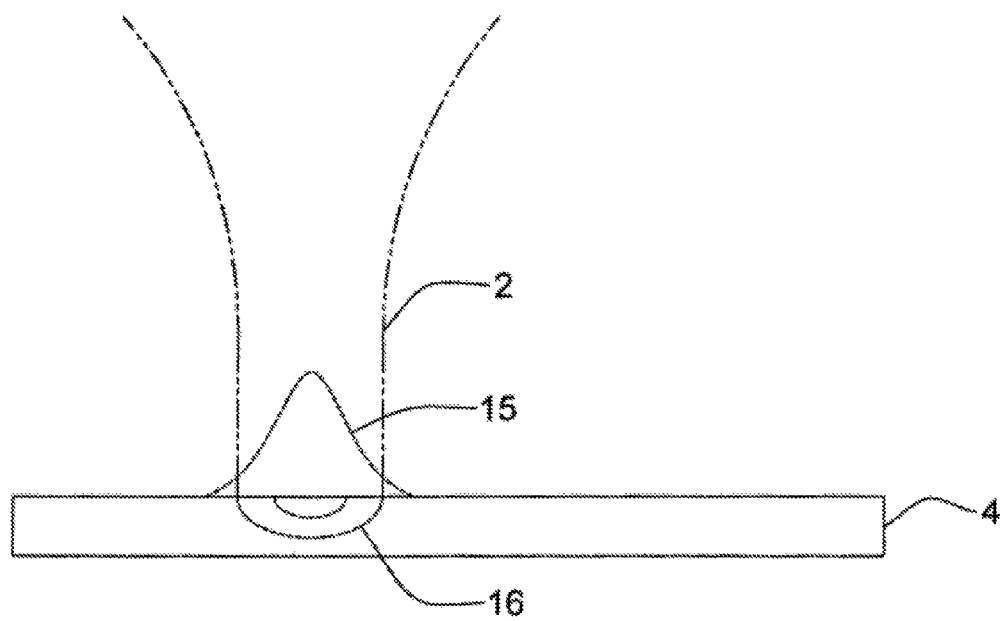
FIG. 6a illustrates a cross sectional view of a Gaussian beam energy distribution and the corresponding temperature profile produced, in accordance with an embodiment of the present invention.
Figure 6B:
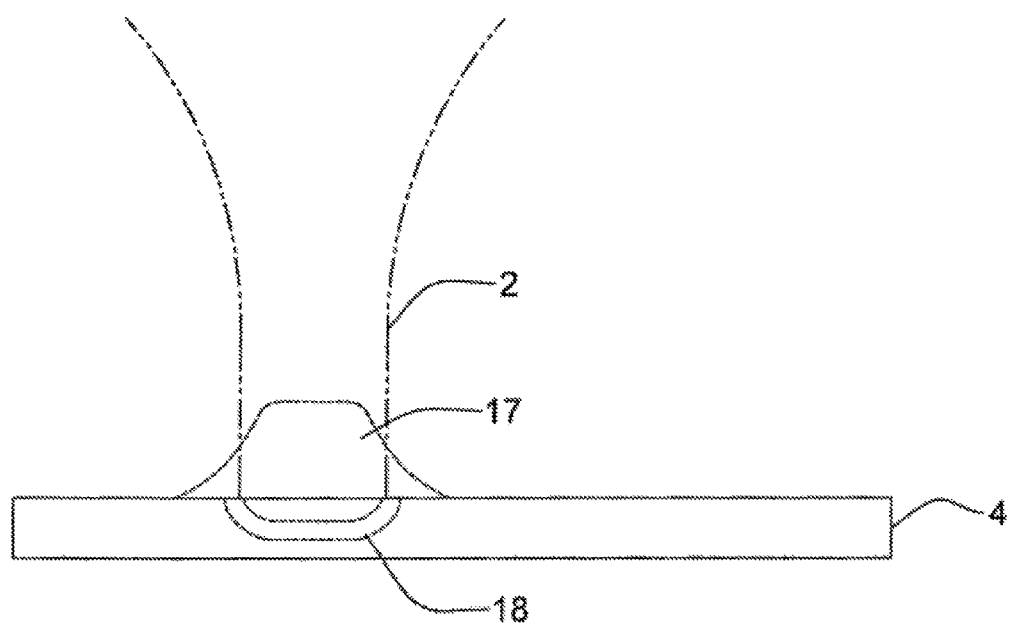
FIG. 6b illustrates a cross sectional view of a top-hat beam energy distribution and the corresponding temperature profile produced, in accordance with an embodiment of the present invention. According to certain embodiments of the present invention, this top-hat distribution differs from a Gaussian, flat top distribution.

The spatial distribution of the laser beam can be used to increase the process window. For example, (FIG. 6A) shows a typical Gaussian spatial distribution (15), that may produce a temperature gradient in the substrate (16) while (FIG. 6B) has a flat top or top hat spatial distribution (17) allowing for a more uniform temperature rise within the substrate (18). The spatial distribution can be used to increase the process window. For example, having a flat top or top hat spatial distribution allows for a uniform temperature rise within the beam spot, whereas a Gaussian distribution may produce a temperature gradient within the beam spot. In order to avoid the risk of substrate damage, according to certain embodiments of the present invention, the maximum energy in the beam is limited by the peak of the Gaussian distribution. Therefore, either the risk of substrate damage may be increased or the available cleaning area within the beam (which is proportional to the cleaning efficiency) will be reduced.

Thermal Management

Because certain embodiment of the present invention include a thermal based process, it may be desirable to manage the overall temperature of the system to avoid damage to thermally sensitive or easily contaminated materials. This is particularly true in the case of photomask haze cleaning without pellicle removal. The pellicle films typically have a low thermal damage threshold. Therefore, it would be useful to avoid an overall system temperature build up that may transfer to and damage the pellicle material. This includes the pellicle frame and the enclosed environment between the mask surface and the pellicle film.

Figure 7:
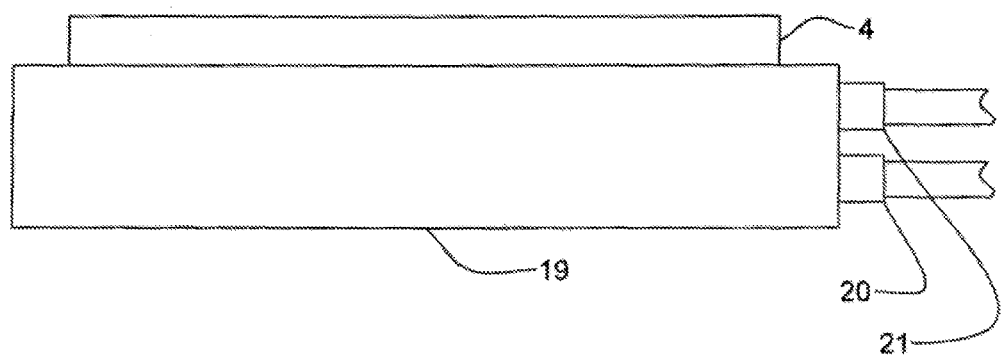
FIG. 7 illustrates a diagram of a photomask with a cold plate contacting the bottom of mask, in accordance with an embodiment of the present invention. According to certain embodiments of the present invention, the contact point that may be for example water, a fluid or gas that flows through the cold plate or electrical contact for thermoelectric cooling.

Managing the system temperature can be accomplished in several ways. The following examples illustrate representative methods of sample cooling and it is understood that other methods may exist. One way to manage the system temperature is through contact cooling. The photomask, for example, may be placed in contact with a plate that acts as a heat sink to draw the heat generated on the front surface of the mask toward the back of the mask (FIG. 7). Here (20) and (21) are the input and output for the flow of cooling liquids or gases through the heat sink (19). This can reduce the heat transfer to the air above the mask surface and the heat transferred to the adhesive between the pellicle frame and the mask surface. This can be accomplished in a variety of ways including a cooling liquid, gas or thermoelectric cooling.

Figure 8:
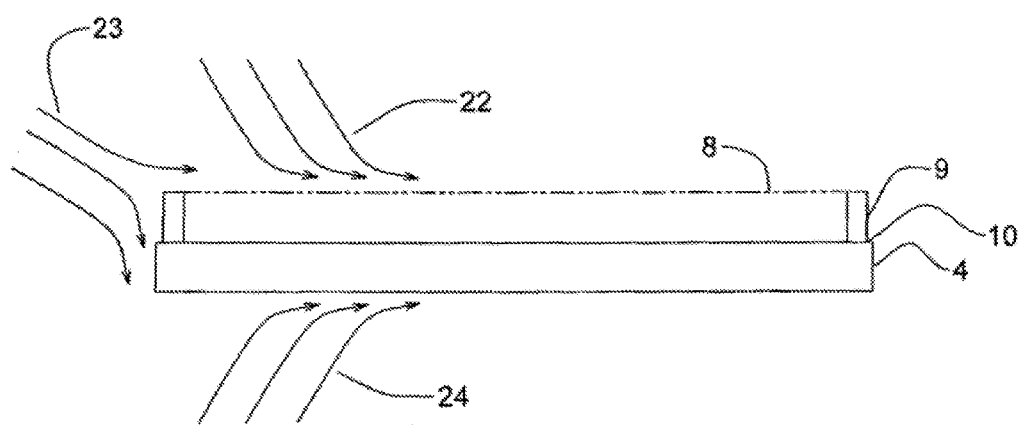
FIG. 8 illustrates a diagram showing force air cooling of areas on the photomask, in accordance with an embodiment of the present invention.

Another potential way to control temperature is through directed air flow cooling (FIG. 8). In these embodiments, airflow is directed onto portions of the mask (22), onto the pellicle film (23), pellicle frame or adhesives areas (24) to directly reduce the thermal build up in these materials. This not only reduces the risk of pellicle film damage but also reduces the risk of creating contaminating out-gassing from the pellicle frame and pellicle film adhesives. In addition to hardware control of the system thermal buildup, it is possible reduce thermal build up by allowing for an increased process time. Applying a slower rate of pulses to the system or allowing a delay between a series of pulse application allows the resultant heat to be removed while still allowing direct heating of the contaminants.

Figure 9A:
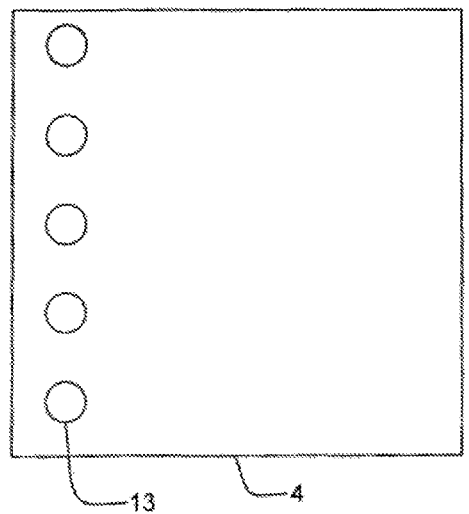
FIG. 9a illustrates a diagram showing a single pass of the laser beam across surface to minimize local thermal build up, in accordance with an embodiment of the present invention. In the diagram, a single row or column with large lateral spacing between spots is illustrated.
Figure 9B:
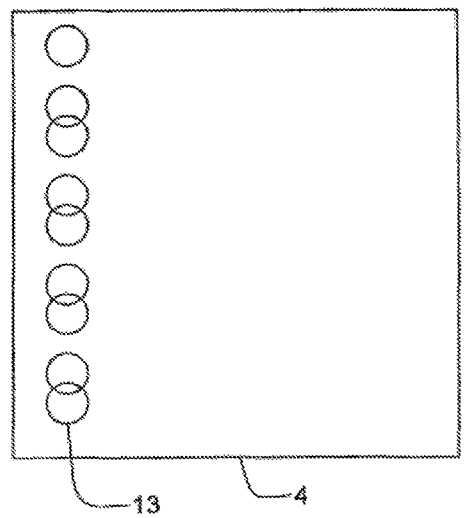
FIG. 9b illustrates a diagram showing two passes of the laser beam across surface to minimize local thermal build up, in accordance with an embodiment of the present invention. In the diagram, a single row with two sets of beam spots overlapped with large spacing between sets of pulses is illustrated.
Figure 9C:
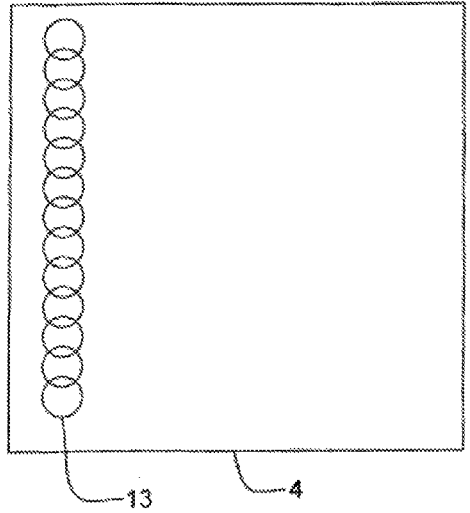
FIG. 9c illustrates a diagram showing multiple laser passes over an area of the substrate to achieve complete cleaning of the section of the substrate, in accordance with an embodiment of the present invention.
Figure 9D:
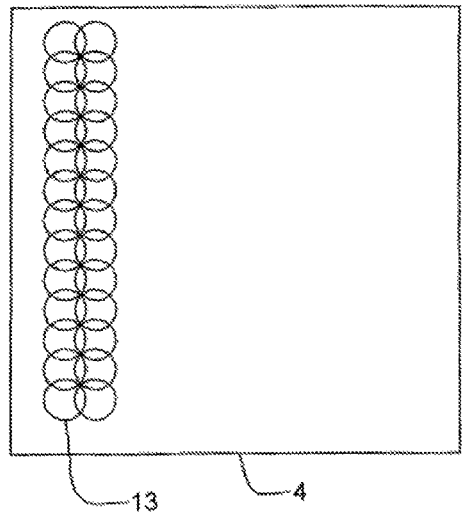
FIG. 9d illustrates a diagram illustrating second dimension of surface cleaning, in accordance with an embodiment of the present invention.
Figure 9E:
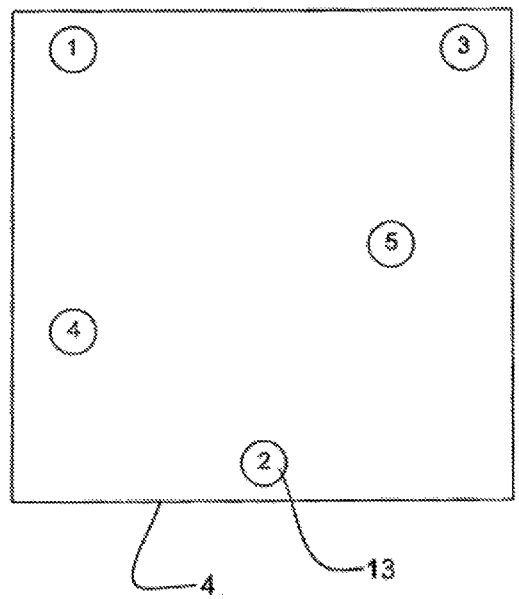
FIG. 9e illustrates a diagram representing the use of non-contiguous pulses on the surface, in accordance with an embodiment of the present invention.

According to certain embodiment of the present invention, pulse to pulse thermal build is also controlled and depends on the thermal characteristics of the contamination, substrate and adjacent materials. For example, pulse to pulse thermal build up is controlled by reducing the number of laser pulses hitting the surface per unit time. This temperature build up can also be controlled by increasing the distance between adjacent laser pulses. Also, a large lateral displacement between adjacent pulses may be used, where the material is particularly sensitive to pulse-to-pulse thermal build (i.e. pellicle film materials). In this case, the process may involve positioning the laser beam to nearly the same locations multiple times to obtain full cleaning of the target surface. For example, a first series of laser pulses may be exposed to the surface with a relatively large lateral separation (FIG. 9a). A second pass over the same area then places an additional series of laser pulses that are slightly shifted relative to the first set of spots (FIG. 9b). This process typically continues until the entire area has been exposed to the laser pulses (FIG. 9c). Overlap in a second direction can be used to completely expose a substrate surface (FIG. 9d). This overall process may be repeated or the overlap between passes may be increased, if the cleaning process includes multiple pulses for complete removal. Changing the position of the beam relative to the surface as illustrated can be accomplished by moving the beam or moving the substrate. In addition, applying pulses in a more systematically distributed manner across the mask may reduce further the likelihood of heat buildup on the mask (FIG. 9E).

Residue Control

According to certain embodiments of the present invention, the inventive laser cleaning method may produce residual materials on the photomask surface depending on the decomposition products of the contamination. Even if the residues no longer affect the use of the substrate material (substrate is effectively cleaned), there may still be a reason to control there location. Traditional methods for controlling residue formation such as applying a directed airflow, water flow or creating a reduced pressure over the substrate to be cleaned could be used within the scope of certain embodiments of the present invention. However, for the case of an enclosed system, such as a pellicalized photomask, these environmental controls typically cannot be used. Thus, alternative methods for controlling the location of residual materials are used for a closed system.

Figure 10:
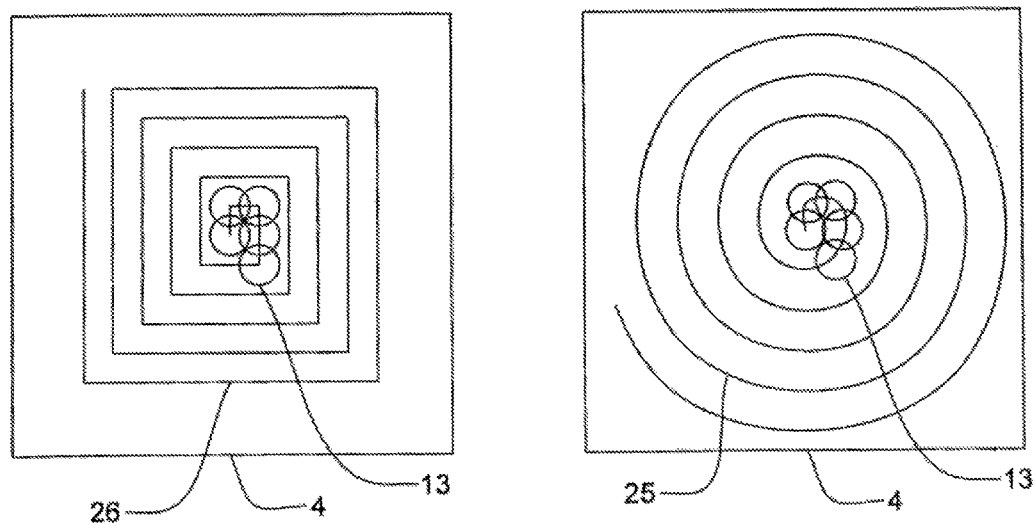
FIG. 10 illustrates a diagram employing a laser pulse pattern to control the location of residual materials, in accordance with an embodiment of the present invention.
Figure 11A:
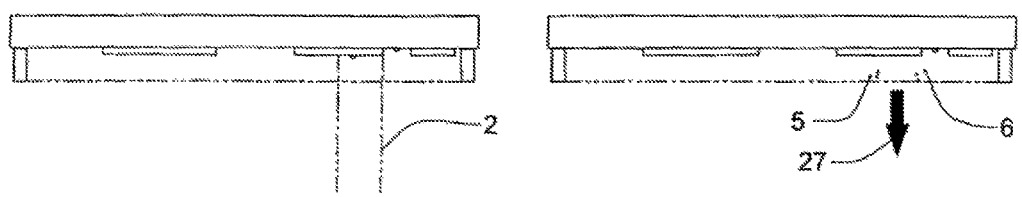
FIG. 11a illustrates a diagram demonstrating the use of gravity to control the location of residual materials, in accordance with an embodiment of the present invention.
Figure 11B:
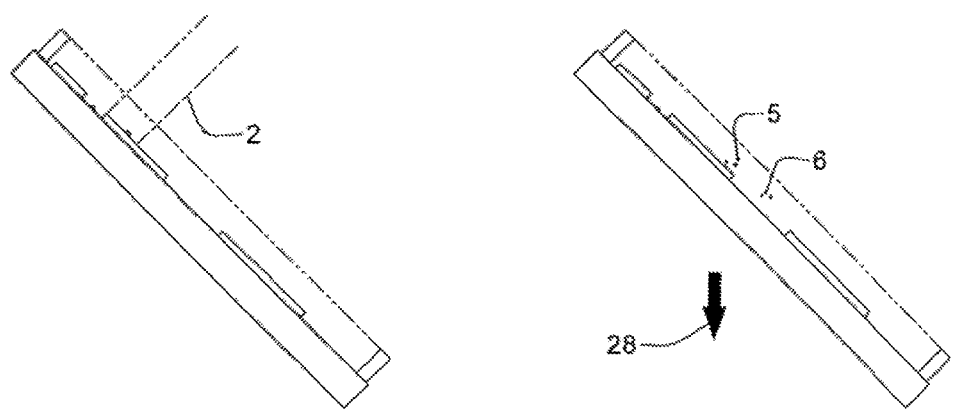
FIG. 11b illustrates a diagram illustrating the use of gravity to control the location of residual materials, in accordance with an embodiment of the present invention.

One representative method includes controlling the pattern of laser pulses. For example, in (FIG. 10) if the pattern of laser pulses starts in the center of the substrate surface and is directed into an increasing diameter circular (25) or increasing dimension square pattern (26), residual material will be preferentially moved toward the edges of the substrate. Another representative method to control residue is to utilize gravity. Placing the photomask with the surface facing down (FIG. 11a) or tilted (FIG. 11b) will typically allow preferential deposit of residue materials on the pellicle film (27), or side of the photomask (28), respectively. In addition, reducing the temperature of an area of the photomask, pellicle or pellicle frame can create preferential depositing of residue material to these surfaces, since this material is likely to be generated from a vapor phase transition to a liquid or solid (FIG. 8).

Metrology

Figure 12:
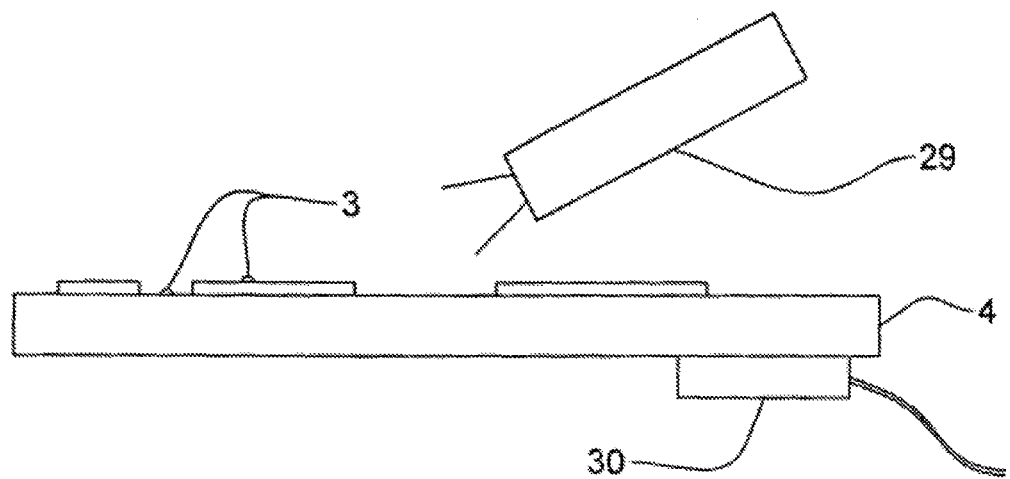
FIG. 12 illustrates a schematic diagram of contaminated substrate surface with thermocouple or infrared temperature monitoring devices, in accordance with an embodiment of the present invention.

According to certain embodiments of the present invention, a method is provided that may also be used in combination with metrology to monitor process parameters and/or to evaluate the progression or completion of the cleaning process. Measurement of the locally generated temperature of the substrate materials can be used in combination with the cleaning process. Temperature measurement can, for example, be evaluated prior to application of the cleaning process in order to verify risk of temperature related damage. In addition, these temperatures may be monitored during the cleaning process to verify process control and reduce the risk of material damage. For example, the temperature of the substrate may be monitored during the process and the cleaning process may be turned off if too large a temperature build up is detected. Multiple methods of temperature monitoring exist (FIG. 12) and include contact (e.g., thermal-couples—29) and non-contact (e.g., infrared cameras—30) methods.

Figure 13:
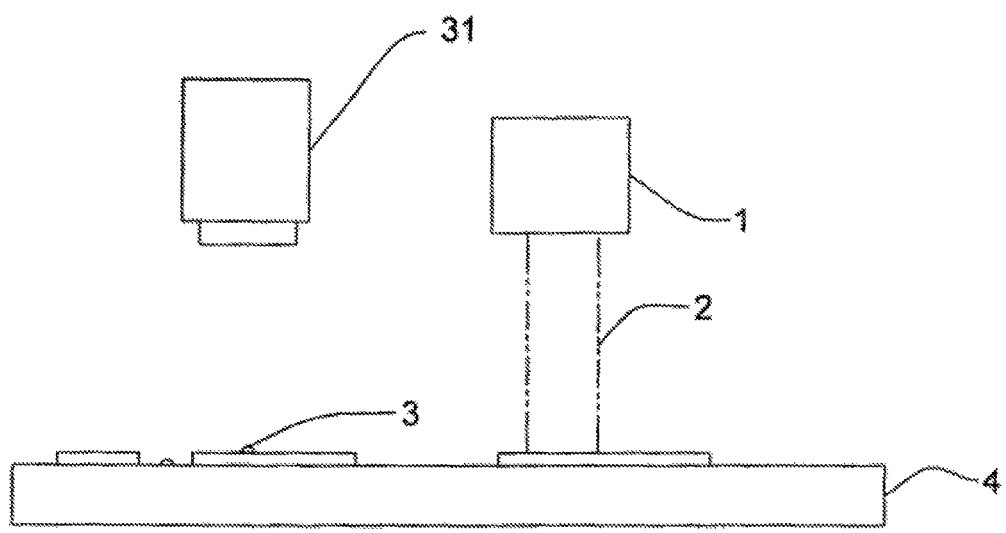
FIG. 13 illustrates a schematic diagram of contaminated substrate surface with imaging, microscopy or spectroscopy system for contamination analysis, in accordance with an embodiment of the present invention.

Metrology may also be used to analyze the contamination for material properties prior to, during or after the removal process (FIG. 13). Here (31) could be optical, spectroscopic techniques or any other means that can be used to detect the contaminant. Identification of the contaminant prior to running the cleaning process can be used to set the ideal processing parameters. This allows use of the minimum process temperature reducing the risk of substrate damage. Monitoring the contamination during or after the process can also be used to assess the completion of the cleaning process based on the strength of the measurement signal as the cleaning process progresses. In addition, monitoring for alternative materials during or after the process may be used to signal when the process is creating a different contamination or causing an undesired change in the substrate material. This information may be used to control the process and/or reduce the risk of substrate damage or a poor cleaning result and determine if the photomask requires another clean with the current process or a process with different parameters/conditions.

Alternative metrologies to monitor the presence and amount of surface contamination may also be used prior to, during and/or after the cleaning process. For example, metrology used to detect the presence of contamination may be used to determine whether or not to apply laser pulses to the region of the substrate that was measured. This information can then be used to minimize the number of pulses applied to the overall substrate which reduces the total thermal energy applied to the system as well as the overall cleaning process time. Metrology to measure the lateral size/dimensions, location, number, density and/or height (thickness) of the contamination or contaminating particles can also be used in combination with the cleaning process. These measurements can be used to qualify the efficiency and completion of the process by measurement before and after the cleaning process. During the process, these measurements can be used to evaluate the in-situ efficiency of the processes.

Figure 14:
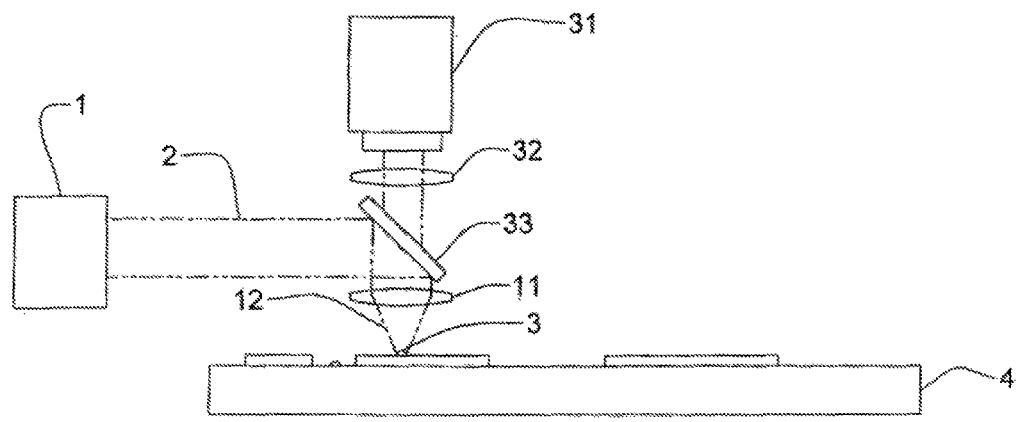
FIG. 14 illustrates a schematic diagram of a contaminated substrate surface with an imaging system where imaging system and laser beam delivery common paths, in accordance with an embodiment of the present invention.

For example, if it is desirable to use multiple laser pulses for complete removal, detection of remaining contamination can be used to evaluate the number of pulses required for removal and if additional pulses are necessary. In this case, the metrology may be designed to view the area being cleaned while the cleaning process is occurring. This may be done, for example, by imaging the area being exposed by the laser (FIG. 14) and may or may not include using the optics such as (33) half mirror and (32) focusing for optical components. Multiple methods exist for detection of particles and evaluation of particle dimensions. These methods include reflected and transmitted light intensity measurement, imaging, low angle scattered light detection, interferometry, scanning electron beam microscopy, focused ion beam microscopy, scanning tunneling microscopy, near field microscopy, atomic force microscopy, infrared spectroscopy, visible spectroscopy, ultraviolet spectroscopy, X-ray spectroscopy, X-ray crystallography, photoelectric spectroscopy, auger electron spectroscopy, magnetic resonance imaging, nuclear magnetic resonance spectroscopy, Raman spectroscopy, florescence spectroscopy, etc. All of these methods, and others, are within the scope of certain embodiments of the present invention and multiple methods may be combined to provide additional information.

In the case of a photomask, for example, multiple metrologies can be incorporated into the laser cleaning process. Identifying the presence of a specific contamination (e.g., ammonium sulfate) on a photomask, for example, can define the decomposition temperature requirement and allow selection of laser energy just high enough to perform the cleaning process. Transmitted light intensity may also be measured and the result compared with the programmed structure for the absorbing film on the photomask surface. Discrepancies between programmed features and detected features may then be used to identify contamination. In addition, Aerial Imaging Measurement may be used to evaluate the print characteristics of the photomask. This method is typically used to evaluate the effect of contamination on the performance of the photomask. This measurement is also typically used in-situ to detect damage to the absorber layer resulting from the clean process. This is particularly relevant for partially absorbing films in which the thickness of the film has a direct relationship to the photomask performance. In addition, combining scattered and transmitted light techniques would allow detection of irregular surface topography which would differ from the typically smooth surface of the photomask and photomask film enhancing contaminant identification. The thin film layer may be patterned and may include void areas under which respective portions of the substrate are exposed.

Metrology is also used, according to certain embodiments of the present invention, to monitor the characteristics of materials adjacent to the surface being cleaned. For example, the temperature of a pellicle film above a photomask may be monitored to reduce the risk of pellicle film damage. The transmission characteristics of the pellicle film may also be used to qualify the effects of the cleaning process during or after the clean process. In addition, detection of particulates on the inside of the pellicle film is sometimes made prior to performing the clean process and is sometimes used to detect loss of these particles during the process or whether or not there needs to be a limit of the energy used on the process to prevent the risk of pellicle or substrate material damage As will be appreciated by one of skill in the are, the previous metrology examples are not intended to be all inclusive but rather merely illustrate the use of metrology within the scope of certain embodiments of the present invention.

Apparatus

Figure 15:
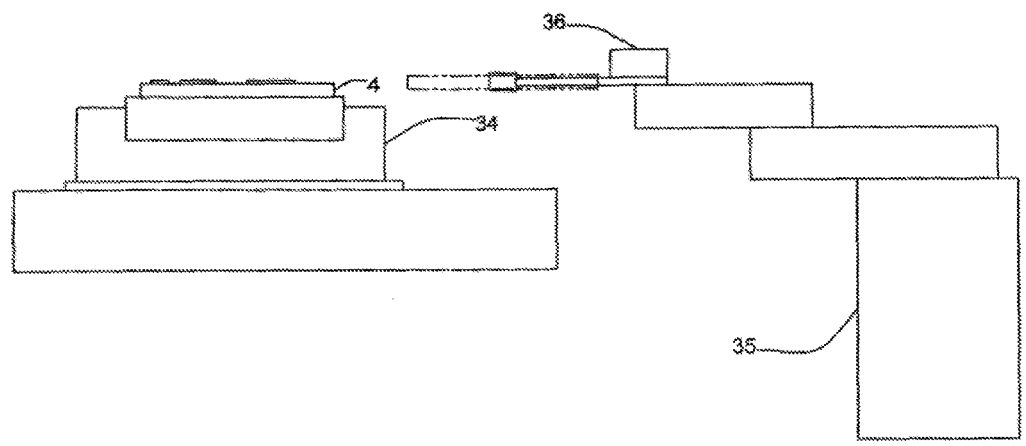
FIG. 15 illustrates a system diagram showing robotic load and X/Y/Z stage motion of substrate relative to laser beam, in accordance with an embodiment of the present invention.

Certain embodiments of the present invention can be incorporated into an apparatus used to perform the laser surface cleaning process. This apparatus (FIG. 15) may additionally have the capability to robotically handle the substrate material (35) with mask handling end effector (36) and/or one or more axes of motion to position the substrate sample relative to the laser beam. The apparatus may contain one or more of the metrologies as described above and may contain components and/or devices useful for controlling the temperature of the substrate and/or adjacent materials during the cleaning process. In addition, the apparatus may contain metrology used to register the substrate (34) in (FIG. 15) to the staging system and therefore to the laser beam. This metrology may include, for example, computer controlled vision recognition systems. The apparatus may also utilize computer control of the laser, motion and metrology and may provide for software based recipe control of the cleaning process. Laser control may, for example, consist of controlling when laser pulses are applied as well as the amount of energy applied during the cleaning process.

Wafer Fabrication Process

According to certain embodiments of the present invention, a method and/or apparatus is provided that can be used as part of a novel wafer fabrication process that includes the removal of haze formation from a pellicalized photomask surface. For example, methods for cleaning silicon wafers are within the scope of certain embodiments of the present invention.

Currently, available photomasks are taken out of the wafer print process when the level of haze has become enough to adversely affect the process. The time when currently available photomasks are removed from the wafer printing process is determined either by direct detection of a high level of haze contamination or is pre-determined based on the duration and level of use in the wafer printing process. Typically, the currently available photomask is sent to a different facility to have the pellicle removed, the photomask is cleaned and another pellicle attached to the photomask. These other facilities (e.g., mask shops) maintain the equipment required to accomplish these tasks as well as to perform photomask repair and additional inspections not typically present at a wafer fabrication facility. Duplicate sets of photomasks are typically used during the time required to have the currently available photomasks cleaned and a new pellicle attached. These additional photomasks add a significant cost to the overall wafer print process because of the high material and setup and evaluation costs required.

Figure 16A:
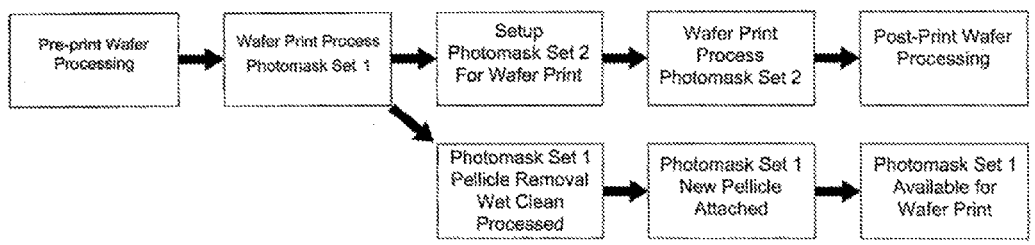
FIG. 16a illustrates a box diagram of typical wafer fabrication process utilizing photomask wet clean processing, in accordance with an embodiment of the present invention.
Figure 16B:
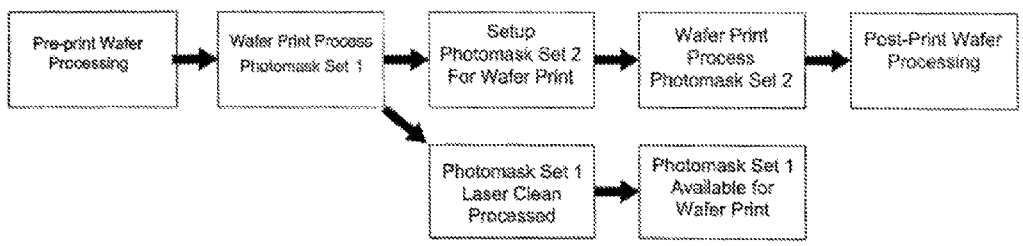
FIG. 16b illustrates a box diagram of wafer fabrication process flow incorporating use laser photomask cleaning without pellicle removal, in accordance with an embodiment of the present invention.

According to certain embodiments of the present invention, a novel wafer fabrication method is provided that incorporates an apparatus that implements one or more methods according to embodiments of the present invention to clean a photomask surface of haze. A representative wafer fabrication process according to the present invention and illustrating the use of wet clean processing to remove photomask contamination is shown in FIG. 16a. An alternative embodiment of the present invention utilizes a laser cleaning method described above to perform the cleaning operation at the wafer fabrication facility and without pellicle removal (FIG. 16b). This eliminates the additional pellicle costs and deterioration of the photomask film produced by the currently available wet clean processing.

Figure 16C:
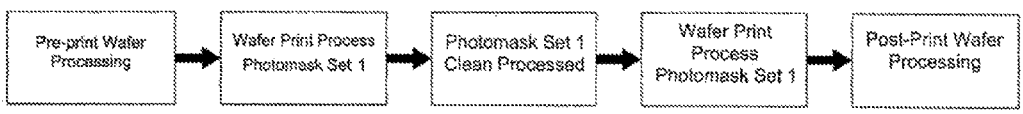
FIG. 16c illustrates a box diagram of wafer fabrication process flow incorporating use of laser photomask cleaning without the use of additional mask sets during the clean process, in accordance with an embodiment of the present invention.

According to certain embodiments of the present invention, a novel wafer fabrication process is provided that eliminates the use of additional masks or mask sets for product manufacture while the original set is being cleaned. In this manufacturing process the original photomask(s) can be placed immediately back into production following the cleaning process (FIG. 16c). This, in some instances, eliminates the use of for duplicate mask sets and, in other instances, decreases the setup times for using duplicate mask sets. The use of inspection metrology to verify the cleaning process may be used prior to returning the photomask back into production. This measurement may, for example, be incorporated into the apparatus or provided by an additional apparatus at the wafer fabrication or other facility. Regardless of the metrology used, if any, the overall process time for the photomask haze removal will be reduced.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents may be resorted to that fall within the scope of the invention.

What is claimed is:

1. A wafer fabrication process, comprising:
pre-print wafer processing;
wafer print processing using at least one photomask having a pellicle;
photomask clean processing, including:
   directing a laser through the pellicle toward an inorganic particle disposed on the photomask to remove the particle from the photomask by thermal decomposition, and
   directing an airflow onto the pellicle to reduce thermal build up in the pellicle;
wafer print processing using the photomask; and
post-print wafer processing.

2. The method of claim 1, wherein the photomask includes a substrate and at least one thin film layer disposed thereon.

3. The method of claim 2, wherein the thin film layer is patterned and includes void areas under which respective portions of the substrate are exposed.

4. The method of claim 1, further comprising maintaining a temperature of the photomask below a threshold temperature to prevent damage thereto.

5. The method of claim 1, wherein the photomask includes a contaminating layer disposed thereon.

6. The method of claim 5, wherein the contaminating layer is a haze layer.

7. The method of claim 6, wherein the haze layer is an ammonium sulfate haze layer.

8. The method of claim 5, wherein the contaminating layer is inorganic.

9. The method of claim 1, wherein a substrate of the photomask has an absorption spectrum that does not include a local maximum at about 7 μm.

10. The method of claim 1, wherein the particle has an absorption spectrum with a local maximum at about 3 μm.

11. The method of claim 1, wherein the particle has an absorption spectrum with a local maximum at about 7 μm.

12. The method of claim 11, wherein the laser has a wavelength that is substantially the same as the local maximum of the particle absorption spectrum.

* * * * *